United States Patent
Janssen et al.

(10) Patent No.: US 6,571,091 B1
(45) Date of Patent: May 27, 2003

(54) POWER CONTROL METHOD AND APPARATUS SUITABLE FOR USE IN A RADIO COMMUNICATION DEVICE

(75) Inventors: John Jerome Janssen, Round Lake Beach, IL (US); Alexander Wayne Hietala, Cary, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/453,217

(22) Filed: May 30, 1995

(51) Int. Cl.[7] .................................................. H04B 1/16
(52) U.S. Cl. ........................ 455/343; 455/127; 455/571
(58) Field of Search ............................... 455/343, 127, 455/117, 230, 38.3, 572, 571; 327/74, 75, 76, 530; 323/222; 320/13, 39

(56) References Cited

U.S. PATENT DOCUMENTS

| | | | |
|---|---|---|---|
| 3,721,834 A | * 3/1973 | Hirschfeld | 327/74 |
| 4,086,525 A | 4/1978 | Ibsen et al. | |
| 4,642,479 A | 2/1987 | Lombardi et al. | 307/141 |
| 4,734,635 A | * 3/1988 | Theobald | 320/13 |
| 4,798,975 A | 1/1989 | Walczak et al. | 307/350 |
| 4,906,055 A | * 3/1990 | Horiuchi | 327/74 |
| 4,912,774 A | * 3/1990 | Saito | 455/117 |
| 5,047,961 A | 9/1991 | Simonsen | |
| 5,063,471 A | 11/1991 | Park | 361/18 |
| 5,073,837 A | 12/1991 | Baek | 361/92 |
| 5,095,308 A | 3/1992 | Hewitt | |
| 5,155,428 A | 10/1992 | Kang | |
| 5,265,271 A | * 11/1993 | Marko et al. | 455/343 |
| 5,424,721 A | 6/1995 | Asai | |
| 5,590,419 A | 12/1996 | Shimo | 455/127 |

FOREIGN PATENT DOCUMENTS

| | | |
|---|---|---|
| EP | 0 240 883 A2 | 3/1987 |
| EP | 0298556 A1 | 7/1988 |
| EP | 439319 A1 | 7/1991 |
| EP | 473187 A2 | 3/1992 |
| EP | 0585021 A | 3/1994 |
| EP | 0 439 319 B1 | 6/1994 |
| GB | 2201558 A | 9/1988 |
| GB | 2231213 A | 11/1990 |
| JP | 4-268852 | 9/1992 |
| JP | 06-252820 | 9/1994 |
| JP | 7-131402 | 5/1995 |
| JP | 07-131402 | 5/1995 |
| WO | 93/06664 | 4/1993 |

OTHER PUBLICATIONS

German Patent Office Action, Nov. 10, 2000, 196 21 439.4.

* cited by examiner

*Primary Examiner*—Lee Nguyen
(74) *Attorney, Agent, or Firm*—Kirk W. Dailey; Sylvia Chen; Roland K. Bowler, II

(57) ABSTRACT

A portable radio communication device (303) includes power control circuitry (315) for monitoring the voltage level incoming from a battery (317), and provides power to the rest of the radio communication device (303). The power control circuitry (315) includes a boost regulator (407) that is used to generate an internal reference signal for use throughout the radio communication device including an analog to digital converter (ADC) for digitizing the battery voltage for use by the power control circuitry (315). The power control circuitry (315) compares the digitized battery voltage to thresholds to control power to the remainder of the radio communication device (303). Additionally, a secondary comparator (413) is provided to prevent damage to the battery and radio communication device circuitry. The secondary comparator uses multiple undervoltage thresholds depending upon the power state of the radio communication device (303).

20 Claims, 5 Drawing Sheets

POWER CONTROL METHOD AND APPARATUS SUITABLE FOR USE IN A RADIO COMMUNICATION DEVICE

FIELD OF THE INVENTION

Generally, this invention relates to controlling power in electronic equipment and, more specifically, to maximizing the use of a battery's energy in a portable electronic device.

BACKGROUND OF THE INVENTION

Traditionally, power control apparatus have been developed to control power provided by a battery to a portable electronic device. These power control apparatus monitor the voltage of the battery and compare the battery voltage to a hardware undervoltage threshold. If the battery voltage falls below the undervoltage threshold, then the power to the portable electronic device is powered-off. Typically, this threshold is positioned 200–300 millivolts above the lowest operating voltage of the portable electronic device. In radio communication devices, the threshold was typically positioned 200–300 millivolts above the operating voltage of voltage regulators in the radio communication device. The voltage regulators are used to provide a steady reference to the rest of the radio communication device. By providing such a threshold, the radio communication device's operation was very reliable, however, some unused energy remained in the battery. The amount of the unused energy differed depending upon the type of battery attached to the radio communication device.

Figure 1:
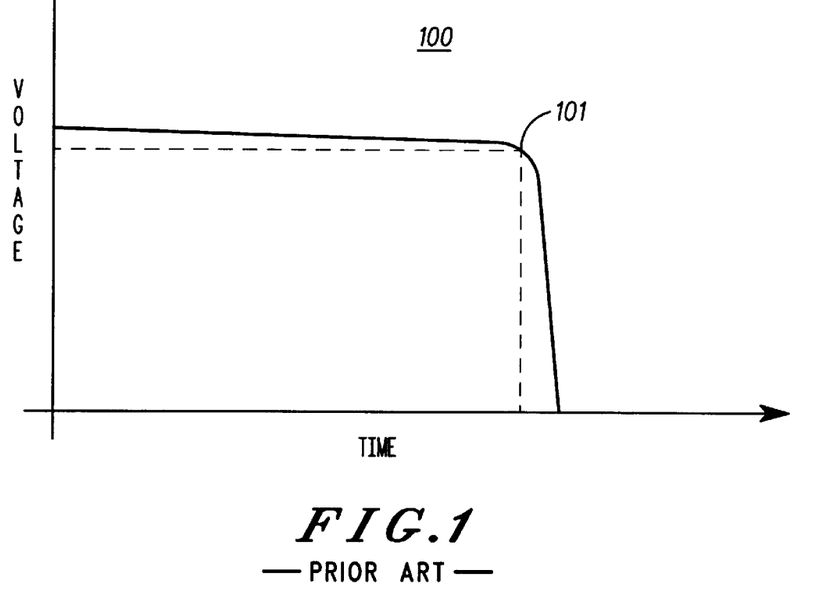
FIG. 1 is an illustration of a voltage/drain characteristic of a NiCd battery as is know in the art.
Figure 2:
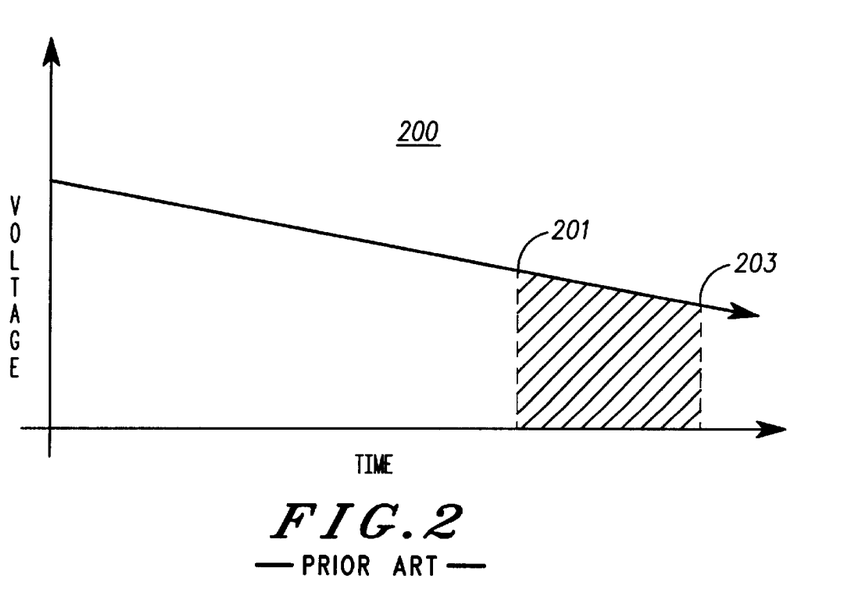
FIG. 2 is an illustration of a voltage/drain characteristic of a lithium ion battery as is known in the art.

FIG. 1 is an illustration of a voltage/drain characteristic 100 of a NiCd (nickel cadmium) battery. As can be seen from the voltage/drain characteristic, the amount of unused energy remaining in the battery after reaching the traditional undervoltage threshold 101 is minimal. FIG. 2 is an illustration of a voltage/drain characteristic 200 of a lithium ion battery. As can be seen from FIG. 2, the lithium ion battery has a linear voltage/drain characteristic. Consequently, a significant portion of unused energy remains in the battery after reaching the traditional undervoltage threshold 201. If a lower undervoltage threshold could be provided, such as threshold 203, then the operating time of the battery powered equipment would be significantly increased.

In the portable electronic device market there is a push by the manufacturers to provide long lasting operation. This is particularly true in the radio communication device market. The introduction of lithium ion batteries is a significant advance in battery technology, offering increased operation time of portable electronic devices. However, the impact of this advance is not fully exploited with a traditional power control apparatus, as described above. The traditional power control apparatus powers-off the portable electronic device even though there is a significant portion of unused energy remaining in the battery. Thus, it would be advantageous to provide a power control apparatus to utilize a larger portion of the energy in a battery before powering-off.

BRIEF DESCRIPTION OF THE DRAWINGS

Part 1 of FIG. 6 is an illustration of the performance of a power control apparatus and is known in the prior art.

Part 2 of FIG. 6 is an illustration of the performance of a power control apparatus in accordance with the present invention.

DETAILED DESCRIPTION OF THE PREFERRED EMBODIMENT

The present embodiment describes a portable radio communication device for use in a radio communication system; the radio communication device is powered by a rechargeable battery. The rechargeable battery is a lithium ion battery. However, other batteries such as NiCd, nickel metal hydride, and their equivalents could be used. The portable radio communication device includes power control circuitry for monitoring the voltage level incoming from the battery and provides power to the other electronic components, including radio circuitry, contained within the radio communication device.

The power control circuitry includes a boost regulator that provides a constant level output voltage independent of the input voltage, including input voltages which are less than the output regulated voltage. The boosted regulator output signal is used to generate an internal reference signal for use throughout the radio communication device, including an analog to digital converter (ADC) for digitizing the battery voltage for use by the power control circuitry. The digitized battery voltage is compared to at least one threshold and in response to the comparison, the radio communication device is put into a powered-off state in one of many known manners, such as that described in U.S. Pat. No. 4,642,479, issued on Feb. 10, 1987 and assigned to the assignee of the present invention. Using the boost regulator output signal as a reference to the ADC allows the battery voltage to fall below the voltage of the internal reference signal and shutoff at a lower undervoltage threshold than the traditional undervoltage threshold described in the background of the invention. Using this lower undervoltage threshold maximizes the amount of battery energy used from the battery.

Additionally, a hardware comparator is used to compare the battery voltage to a second battery voltage threshold and a third battery voltage threshold, thereby preventing damage of the battery and radio communication device circuitry. Specifically, when the radio communication device is in a powered-up state, the battery voltage is compared to a first hardware undervoltage threshold that is less than the software undervoltage threshold. When the radio communication device is in a powered-off state, the battery voltage is compared to a second hardware undervoltage threshold that is greater than the software undervoltage threshold. The first hardware undervoltage threshold protects the battery from harm when the software power control circuitry fails. The second hardware undervoltage threshold ensures proper operation of the radio communication device during advancement to the powered-up state. Upon arrival at the powered-up state, the hardware undervoltage threshold switches to the first hardware undervoltage threshold.

Figure 3:
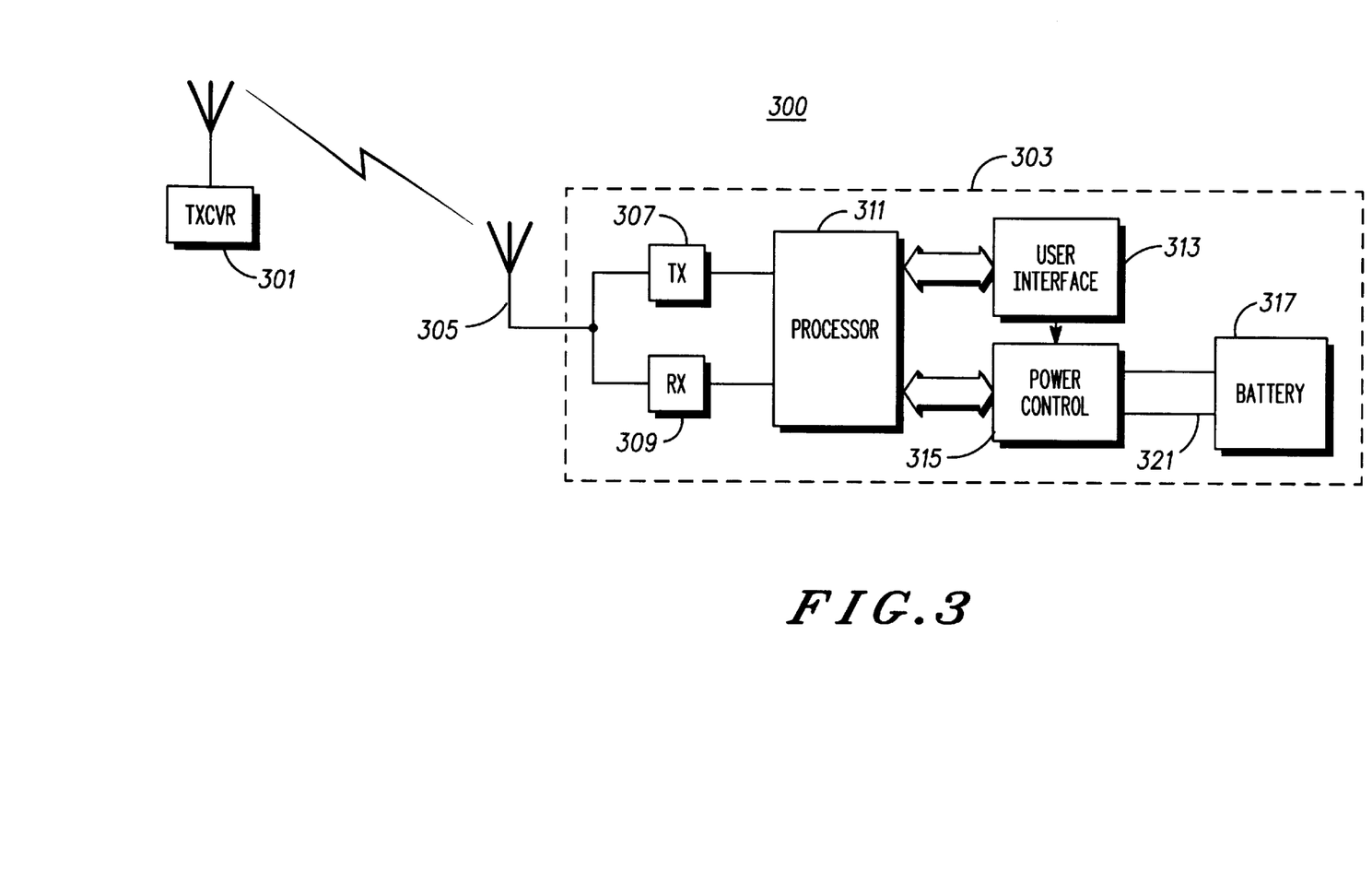
FIG. 3 is an illustration in block diagram form of a radio communication system including a portable radio communication device which may be used in accordance with the present invention.

FIG. 3 is an illustration in block diagram form of a radio communication system 300. The radio communication system 300 includes a fixed site transceiver 301. The fixed site transceiver 301 sends and receives radio frequency (RF)

signals to and from multiple radio communication devices within a fixed geographic area. One such radio communication device is radio communication device 303 of FIG. 3. The RF signals transmitted between the fixed site transceiver 301 and the radio communication device 303 provide radio communication services such as radio telephone service, electronic mail service, wireless fax service, and short message service. Other equally sufficient embodiments of the present invention may include other combinations of these communication services as well as other known radio communication services.

The radio communication device 303, also referred to as a portable electronic device 303, includes an antenna 305, a transmitter 307, a receiver 309, a processor 311, an user interface 313, a power control circuit, also referred to as a power control apparatus 315, and a battery 317. The radio communication device 303 receiver RF signals through the antenna 305. The antenna 305 converts the received RF signals into electrical RF signals for use by the receiver 309. The receiver 309 demodulates the electrical RF signals and recovers the data transmitted using the RF signals. Additionally, the radio receiver 309 outputs the data to the processor 311. The processor 311 includes at least a main microprocessor, such as an MC 68040 available from Motorola, Inc., and associated memory, as well as, other control circuits including integrated circuits and other known technologies. The processor 311 formats the received data output from the radio receiver 309 into recognizable voice or messaging information for use by other parts of the radio device circuitry including the user interface 313. The user interface 313 communicates the formatted data output to the user via a speaker, display, and any other medium of communication.

Upon transmission of RF signals from the radio communication device 303 to the fixed site transceiver 301, the user interface 313 transmits user input data to the processor 311. Such data may include voice data and/or messaging information. The processor 311 formats the information obtained from the user interface 313 and transmits the formatted information to the radio transmitter 307. The radio transmitter 307 converts the formatted information into electrical RF-modulated signals and outputs these to the antenna 305 for transmission to the fixed site transceiver 301.

In the preferred embodiment, the battery 317 is a lithium ion type. Although other batteries such as nickel cadmium and nickel metal hydride and any other known battery type may be substituted, it is believed that this invention is most beneficial to those portable electronic devices which use linear discharge-type batteries, such as lithium ion batteries. The battery 317 outputs a ground signal and a positive battery output signal (B+). The B+ signal has a battery voltage that is monitored by the power control circuitry 315. In the preferred embodiment, the power control circuitry 315 monitors or compares the voltage of the B+ signal to three independent threshold signals. The first threshold is a software shutdown voltage threshold. In order to be compared, the B+ signal is digitized using an ADC that uses an internal reference generated by a boost regulator. Using the boost regulator allows the software undervoltage threshold to be at the lowest operating point of the radio communication device and lower than the traditional hardware undervoltage threshold. As previously discussed, the traditional hardware undervoltage was set 200–300 millivolts above the regulator operating point. This traditional threshold was required because once the battery fell below the voltage of the regulated output the voltage of a non-boosted reference would fall with the voltage of the battery. Thus, in the traditional system, if this lower software undervoltage threshold shutdown was employed, the traditional system would never indicate a shut off condition. Lowering the threshold for shutoff when the radio communication device is in the powered-up state allows use of the unused energy in the battery that could not be used with the traditional hardware undervoltage circuit. This allows the radio communication device 303 to increase its operation time significantly over those phones available in the prior art.

Additionally, the power control circuitry 315 includes a hardware comparison with two additional hardware undervoltage thresholds. While the radio communication device 303 is in the powered-up state, the voltage of the B+ signal is compared to a first hardware undervoltage threshold that is lower than the software undervoltage threshold. In the preferred embodiment, the first hardware undervoltage threshold is set equal to 2.7 volts.

While the portable radio communication device is in the powered-off state, the voltage of the B+ signal is compared to a second hardware undervoltage threshold that is higher than the software undervoltage threshold. In the preferred embodiment, the second hardware undervoltage threshold is set equal to 3.1 volts. The second hardware undervoltage threshold is set to a level that prevents the radio communication device 303 from powering up in an illegal state and ensures operation in the powered-up state of the radio communication device for a reasonable amount of time. Details of the power control circuitry 315 are illustrated in FIG. 4.

Figure 4:
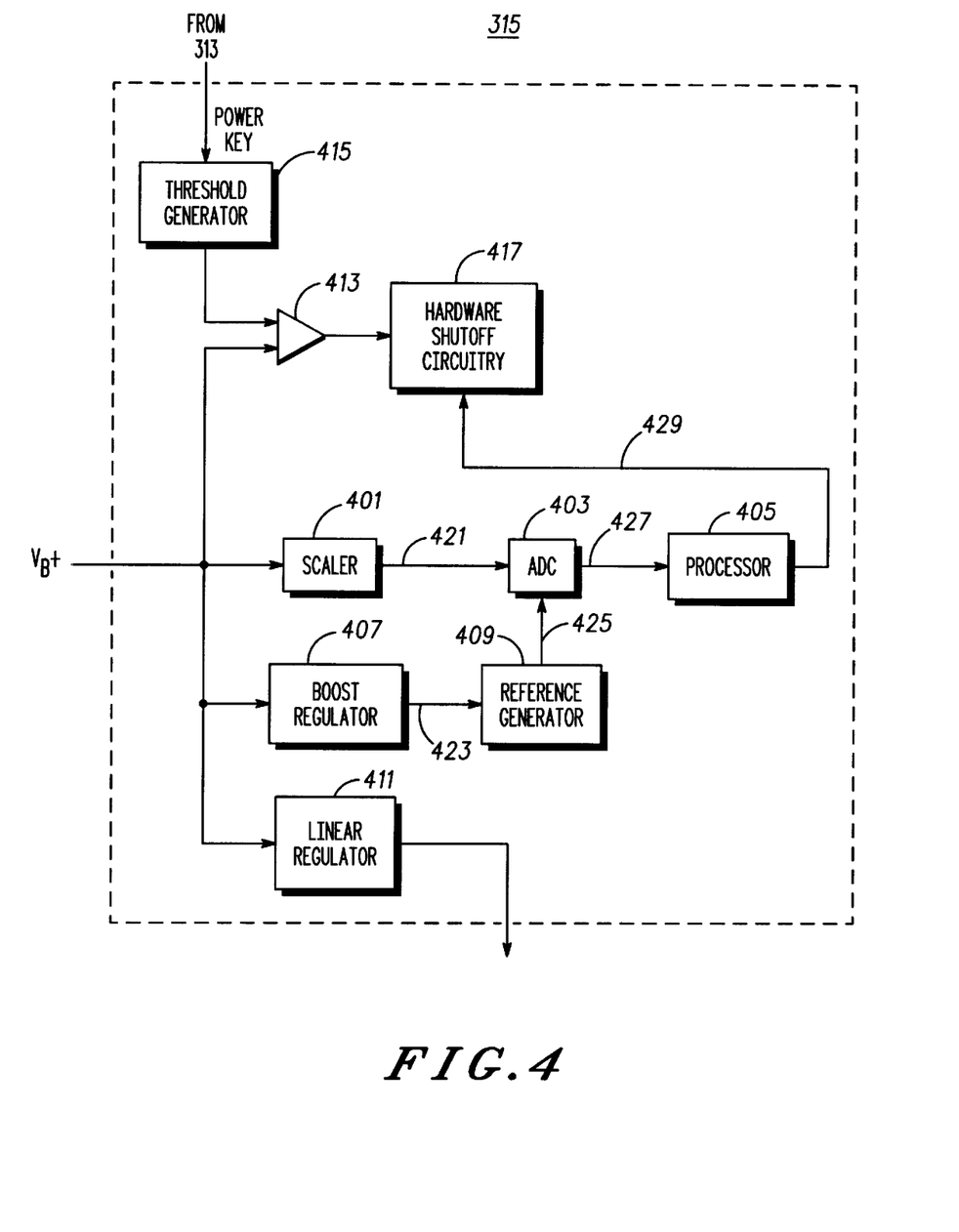
FIG. 4 is an illustration in block diagram form of a power control circuit of FIG. 3 in accordance with the present invention.

FIG. 4 is an illustration in block diagram form of the power control circuitry 315 of FIG. 3. In the preferred embodiment, the power control circuitry 315 includes a scaler 401, an analog-to-digital converter 403 (ADC), a processor 405, a boost regulator 407, a reference generator 409, a linear regulator 411, a hardware comparator 413, a threshold generator 415, and a hardware shutoff circuitry 417.

While the radio communication device 303 is in the powered-up state, the voltage on the B+ signal 321 is input into scaler 401. The scaler 401 is not a necessary part of the present invention but it is preferred. Scaler 401 scales the voltage on the B+ signal 321 to optimally fit an input voltage range of the ADC 403. Additionally, the B+ signal 321 is input into the boost regulator 407, the linear regulator 411, and the hardware comparator 413. The boost regulator 407 may be a boost regulator model MAX 631 available from Maxim Integrated Products. The function of the boost is to provide an output voltage that is higher than its input voltage. Although the power control circuit 315 only includes one linear regulator 411, the actual number of linear regulators used in a radio communication device will vary depending upon the specific needs of the design of the particular radio communication device. The linear regulator 411 is used to provide a regulated voltage to a portion of the radio communication device circuitry included in the radio communication device 303. The proper operation of the linear regulator 411 requires a voltage on the B+ signal at least 0.2 volts higher than the output voltage of the linear regulator 411.

The regulator output signal 423 of the boost regulator 407 carries a boosted regulator voltage and is input into the reference generator 409. In the preferred embodiment the reference generator 409 is used to control variations in the boosted regulator output signal 423 and provide a steady internal reference signal 425 to the ADC 403 as well as other circuitry within the radio communication device 303. The reference generator 409 is not an essential element of the present invention. It is merely a tool by which a smooth reference is provided in the preferred embodiment. Other equally sufficient means, such as an improved boost regulator outputting a more constant voltage level, may be substituted for the reference generator 409.

The ADC 403 utilizes the reference signal to sample the voltage of the B+ signal and generate a digitized battery voltage signal 427. The digitized battery voltage signal 427 is input into the processor 405. The processor 405 may share circuitry with the processor 311 of FIG. 3, or it may be a stand alone processing circuit, depending upon the implementation of the invention. In the preferred embodiment the processor 405 includes a memory device for providing storage of a computer program as well as a microprocessor for executing the steps of the computer program. Details concerning the computer program stored on the computer memory device are illustrated in process flow chart form in FIG. 5. Generally, the digitized battery voltage signal 427 is compared to a predetermined software undervoltage threshold while the radio communication device is in the powered-up state. If the digitized battery voltage falls below the predetermined software undervoltage threshold, then the radio communication device is powered-off in one of many known manners. One such manner is described in U.S. Pat. No. 4,642,479, issued on Feb. 10, 1987 and assigned to the assignee of the present invention and is hereby incorporated by reference. Once the software shutdown is completed, the processor 405 outputs a power-off signal 429 that is input to the hardware shutoff circuitry 417. The hardware shutoff circuitry removes power to the remaining radio communication device circuitry.

If the software shutdown procedure fails to execute due to an unforeseen event, a backup hardware shutdown is provided in the preferred embodiment of the power control circuitry 315. Specifically, the threshold generator 415 outputs a first hardware undervoltage threshold to the comparator 413. The battery voltage, B+, is input to the comparator 413 and compared to the first hardware undervoltage threshold. If the battery voltage B+ falls below the first hardware undervoltage threshold, then the comparator 413 outputs a power-off signal 429 to the hardware shutoff circuitry 417. The hardware shutoff circuitry 417 removes power to the remaining radio communication device circuitry. In the preferred embodiment, the first hardware undervoltage threshold is set equal to 2.7 volts, which is lower than the software undervoltage threshold. Using a hardware shut down circuit as a fail safe or secondary method of power shut down increases the reliability of the power control circuitry 315. Because the hardware used to shut down the radio communication device can operate at significantly lower voltages than the software controlled shut down, the hardware shut down circuitry ensures that the battery and the radio communication device 303 will be shut down properly.

Additionally, the preferred embodiment includes a second hardware undervoltage threshold for comparing the battery voltage B+ thereto when the radio communication device is in a powered-off state. Specifically, when a power key of the radio communication device, located in the user interface 313 of FIG. 3, is depressed by a user to power-on the radio communication device 303, the battery voltage, B+, is compared, at the comparator 413, to a second hardware undervoltage threshold generated by the threshold generator 415. If the battery voltage B+ exceeds the second hardware undervoltage threshold, then the remaining radio communication device circuitry is powered-up in known manner. After a normal power-up procedures are completed, the threshold generator 415 outputs the first hardware undervoltage threshold to the comparator 413. The battery voltage B+ continues to be compared at comparator 413 to one of the thresholds generated by the threshold generator 415, as described above. In the preferred embodiment, the first hardware undervoltage threshold is less than the second hardware undervoltage threshold. Specifically, the second hardware undervoltage threshold is set equal to 3.1 volts and the first hardware undervoltage threshold is set equal to 2.7 volts. Setting the second hardware undervoltage threshold equal to 3.1 volts prevents the radio communication device from powering-up in an illegal state and ensures that upon power-up of the radio communication device 303, the proper operation of all the components contained within the radio communication device 303 for a reasonable length of time such that power off does not occur immediately after turn on, which would be a nuisance to the user of the radio communication device 303.

Figure 5:
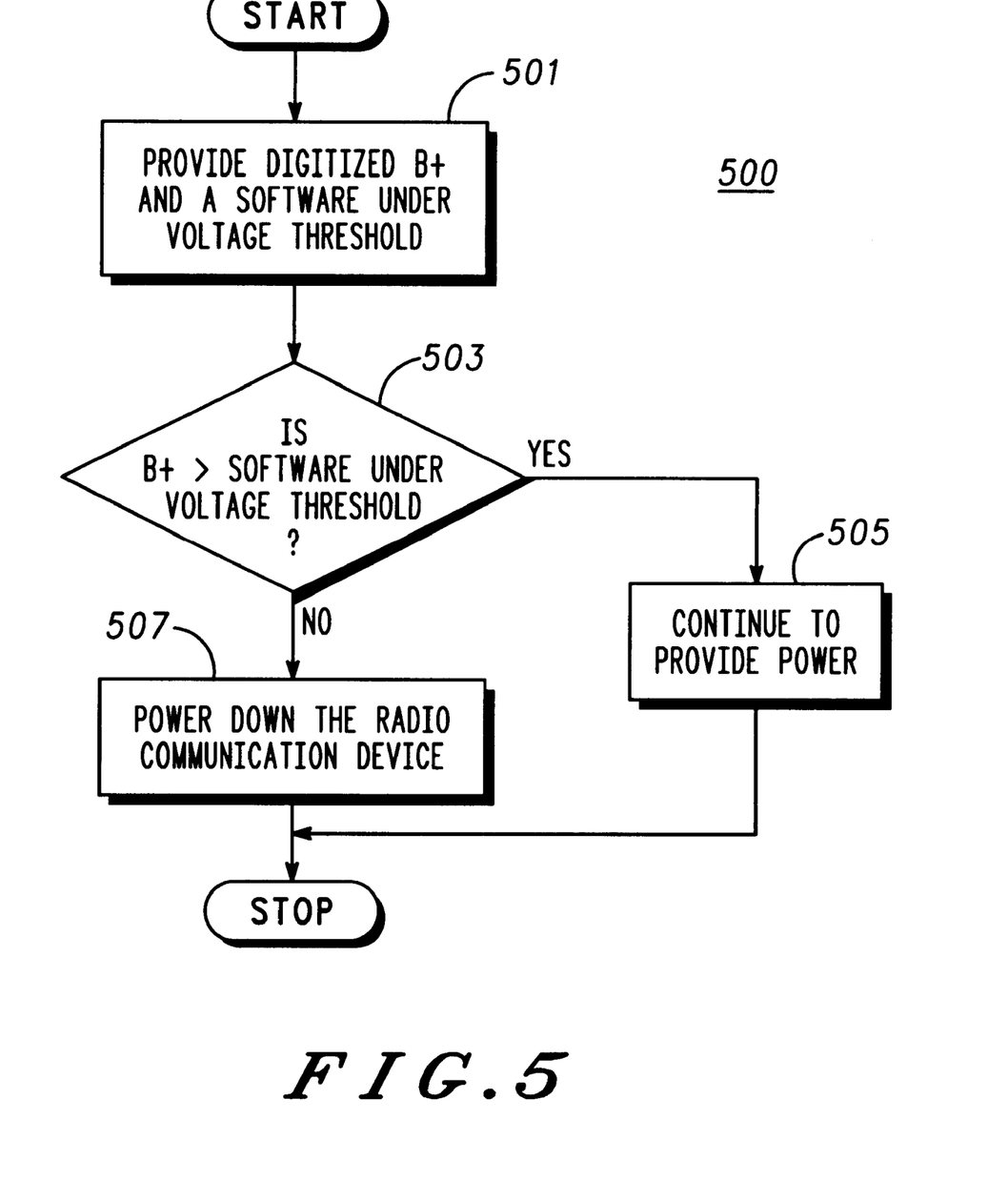
FIG. 5 is an illustration of a process flow chart in accordance with the present invention.

FIG. 5 is an illustration of a process flow chart of the program contained in a memory within the processor 405 in FIG. 5. At block 501, the program provides a digital battery voltage and a software undervoltage threshold. At decision block 503, the program compares the digitized battery voltage B+ to the software undervoltage threshold. If the battery voltage is greater than the software undervoltage threshold, then the program continues to provide power to the remaining circuitry in the radio communication device 303, at block 505. If the digitized battery voltage B+ is less than the software undervoltage threshold, then the program powers down the radio communication device 303 at function block 507. Typically, the power-off function as indicated in function block 507 sends a signal from the radio communication device 303 to the fixed site transceiver 301 indicating that it is ending any communication including communications now in progress with the fixed site transceiver and requests an acknowledge to be returned to the radio communication device 303. Next, the radio communication device 303 waits a predetermined amount of time until an acknowledge signal is returned from the fixed site transceiver 301. After receiving the acknowledge signal, the function block 507 sends a power-off signal 429 from the processor 405 to the hardware shutoff circuitry 417. The hardware shutoff circuitry 417 provides a mechanism for discontinuing power to the remaining circuitry in the radio communication device 303.

Figure 6:
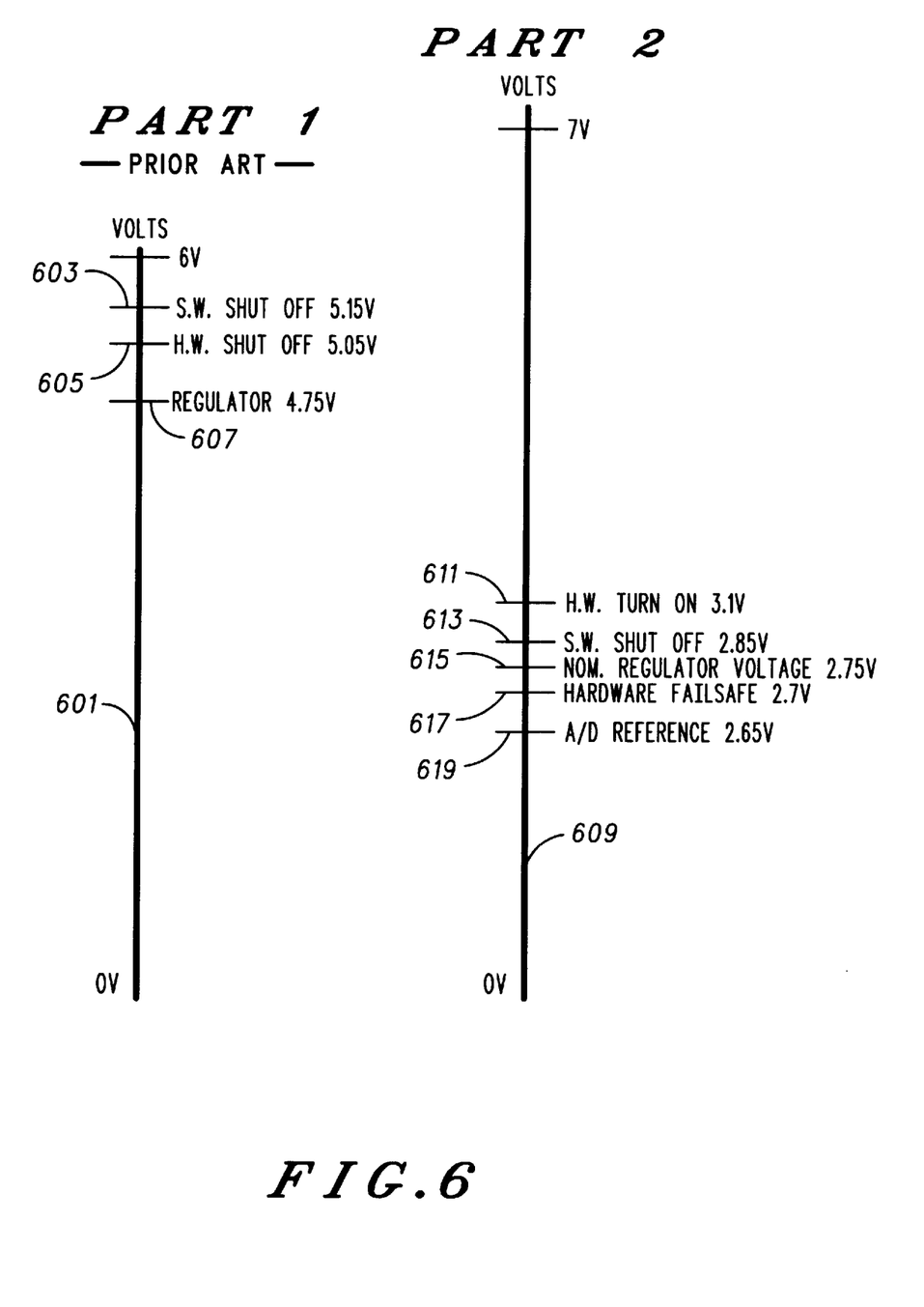

Part 1 of FIG. 6 is an illustration of various undervoltage thresholds and related thresholds available in the prior art. An axis 601 is the indication of battery voltage of a battery available in the prior art with volts varying between 0 and 6 volts. The following thresholds are indicated in part 1 of FIG. 6: a software undervoltage threshold is equal to 5.15 volts as indicated at 603; a hardware undervoltage threshold in the prior art is set equal to 5.05 volts as indicated at 605; and the voltage regulator thresholds within the radio communication device are at 4.75 volts as indicated at 607. Thus, in the prior art the software undervoltage threshold and the hardware undervoltage threshold were both set significantly higher than the operating voltage of the voltage regulators of the radio communication device, as illustrated in Part 1 of FIG. 6.

Part 2 of FIG. 6 is an illustration of various undervoltage thresholds and related thresholds in the preferred embodiment. Here an axis 609 is an indication of battery voltage of the battery 317 of FIG. 3. The battery voltage indicated in 609 varies between 0 and 7 volts. The following thresholds are indicated in part 2 of FIG. 6: a software undervoltage threshold is set equal to 2.8 volts as indicated at reference numeral 613; a nominal voltage regulator threshold for the voltage regulators contained within the radio communication device 303 operates safely at 2.75 volts as indicated at reference numeral 615; a first hardware undervoltage threshold is set equal to 2.7 volts as indicated at 617; and a second hardware undervoltage threshold is set equal to 3.1 volts as indicated at reference numeral 611. The internal reference signal generated at the output of the reference generator 409 is set equal to 2.65 volts as indicated by reference numeral 619. Thus, the present invention, as indicated in Part 2 of FIG. 6, allows the battery voltage, B+, to discharge as low as 2.7 volts before shutting off the radio communication device 303. 2.7 volts is chosen to ensure that the hardware shutoff, including any tolerances, does not encroach upon the software shutoff, thus, ensuring an orderly shutdown sequence. Consequently, the power control circuitry 315 extends the operation time of the radio communication device 303 by allowing the battery voltage to discharge further than the power control circuitry previously available. Additionally, the second hardware undervoltage threshold as indicated at 611 insures proper power-up of the radio communication device 303.

What is claimed is:

1. A power control apparatus for controlling power supplied from a battery to a portable electronic device, the power control apparatus comprising:

a boost regulator, coupled to a battery output signal contact for receiving a battery voltage signal, for generating a regulator output signal;

a reference generator, coupled to the boost regulator, for generating an internal reference signal from the regulator output signal;

an analog-to-digital converter (ADC), coupled to the battery output signal contact and the reference generator, for generating a digitized battery voltage signal responsive to the battery voltage signal and the internal reference signal; and a processor, coupled to the ADC, for comparing the digitized battery voltage signal to a software undervoltage threshold and selectively powering-off the portable electronic device in response to said comparing;

a hardware comparator, coupled to the battery output signal contact, for comparing the battery voltage signal to a hardware undervoltage threshold, wherein the hardware undervoltage threshold is less than the software undervoltage threshold.

2. The power control apparatus of claim 1, the hardware comparator for comparing the battery voltage signal to the hardware undervoltage threshold when the portable electronic device is in a powered-up state and a second hardware undervoltage threshold when the portable electronic device is in a powered-off state.

3. The power control apparatus of claim 2 wherein the hardware undervoltage threshold is less than the software undervoltage threshold and the second hardware undervoltage threshold is greater than the software undervoltage threshold.

4. The power control apparatus of claim 3 wherein the hardware undervoltage threshold is 2.7 volts and the second hardware undervoltage threshold is 3.1 volts.

5. The power control apparatus of claim 1 further comprising:

a voltage scaler, coupled between the battery output signal contact and the ADC, for scaling the battery voltage.

6. A power control apparatus for controlling power supplied from a battery to a portable electronic device, the battery providing an output signal having a voltage, the power control apparatus comprising:

a first hardware undervoltage threshold;

a second hardware undervoltage threshold;

a comparator for comparing the voltage of the output signal to the first hardware undervoltage threshold when a portion of the portable electronic device is in a powered-up state and for comparing the voltage of the output signal to the second hardware undervoltage threshold when the portion of the portable electronic device is in a powered-off state; and a control circuit for selectively powering off the portion of the portable electronic device in response to the voltage of the output signal being less than the first hardware undervoltage threshold and for selectively powering up the portion of the portable electronic device in response to a power key signal only when the voltage of the output signal is greater than the second hardware undervoltage threshold.

7. The power control apparatus of claim 6 wherein the first hardware undervoltage threshold is less than the second hardware undervoltage threshold.

8. The power control apparatus of claim 6 wherein the power control apparatus is disposed within a radio communication device and the portion of the portable electronic device is radio circuitry.

9. A method of controlling power supplied from a battery having a battery voltage to a portable electronic device, the method comprising the steps of:

regulating the battery voltage using a boost regulator and providing a regulator output signal;

generating an internal reference signal from the regulator output signal for use within the portable electronic device;

digitizing the battery voltage using the internal reference signal and providing a digitized battery voltage signal;

comparing the digitized battery voltage signal to a software undervoltage threshold and comparing the battery voltage to a first hardware undervoltage threshold less than the software undervoltage threshold; and selectively powering-off the portable electronic device in response to the step of comparing.

10. The method of controlling power of claim 9 wherein the step of comparing further comprises the step of:

comparing the battery voltage to the first hardware undervoltage threshold when the portable electronic device is in a powered-up state and comparing the battery voltage to a second hardware undervoltage threshold when the portable electronic device is in a powered-off state.

11. The method of controlling power of claim 10 wherein the second hardware undervoltage threshold is greater than the software undervoltage threshold.

12. The method of controlling power of claim 11 wherein the first hardware undervoltage threshold is 2.7 volts and the second hardware undervoltage threshold is 3.1 volts.

13. The method of controlling power of claim 9 further comprising the step of:

scaling the battery voltage, prior to the step of digitizing.

14. A method of controlling power supplied from a battery to a portable electronic device, the battery providing an output signal having a voltage, the method comprising the steps of:

providing a first hardware undervoltage threshold;

providing a second hardware undervoltage threshold;

comparing the voltage of the output signal to the first hardware undervoltage threshold when a portion of the portable electronic device is in a powered-up state and comparing the voltage of the output signal to the second hardware undervoltage threshold when the portion of the portable electronic device is in a powered-off state; and selectively providing power to the portion of the portable electronic device in response to said step of comparing by powering-off the portion of the portable electronic device in response to the voltage of the output signal being less than the first hardware undervoltage threshold and powering-up the portion of the portable electronic device in response to a power key signal only when the voltage of the output signal is greater than the second hardware undervoltage threshold.

15. The method of controlling power of claim 14 wherein the first hardware undervoltage threshold is less than the second hardware undervoltage threshold.

16. A radio communication device comprising:

a battery having a battery voltage;

radio circuitry having power provided by the battery;

a power control apparatus, coupled between the battery and the radio circuitry, for controlling the power provided to the radio circuitry provided by the battery, the power control apparatus including:

a boost regulator for regulating the battery voltage and generating a regulator output signal;

a reference generator, coupled to the boost regulator, for generating an internal reference signal from the regulator output signal;

an analog-to-digital converter (ADC) coupled to the battery and the reference signal generator, for generating a digitized battery voltage signal; and a processor, coupled to the ADC, for comparing the digitized battery voltage signal to a software undervoltage threshold and selectively powering-off the radio communication device in response to said comparing;

a hardware comparator, coupled to the battery, for comparing the battery voltage to a first hardware undervoltage threshold, wherein the first hardware undervoltage threshold is less than the software undervoltage threshold.

17. The radio communication device of claim 16, the hardware comparator for comparing the battery voltage to the first hardware undervoltage threshold when the radio communication device is in a powered-up state and a second hardware undervoltage threshold where the radio communication device is in a powered-off state.

18. The radio communication device of claim 17 wherein the second hardware undervoltage threshold is greater than the software undervoltage threshold.

19. The radio communication device of claim 18 wherein the first hardware undervoltage threshold is 2.7 volts and the second hardware undervoltage threshold is 3.1 volts.

20. The radio communication device of claim 16 further comprising a voltage scaler, coupled between the battery and the ADC, for scaling the battery voltage.

* * * * *